(12) United States Patent
Ota (10) Patent No.: US 8,301,337 B2
(45) Date of Patent: Oct. 30, 2012

(54) ANALOG/DIGITAL CONVERSION CIRCUIT, SEMICONDUCTOR DEVICE, AND ELECTRIC POWER STEERING CONTROLLING UNIT

(75) Inventor: Naoya Ota, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 110 days.

(21) Appl. No.: 12/851,835

(22) Filed: Aug. 6, 2010

(65) Prior Publication Data
US 2011/0035092 A1 Feb. 10, 2011

(30) Foreign Application Priority Data
Aug. 7, 2009 (JP) ................................. 2009-184944

(51) Int. Cl.
G06F 7/00 (2006.01)
(52) U.S. Cl. ........................................................ 701/36
(58) Field of Classification Search .................... 701/36, 701/41; 341/126, 144, 155, 158, 164
See application file for complete search history.

(56) References Cited

U.S. PATENT DOCUMENTS
5,724,039 A * 3/1998 Hayashi ......................... 341/144
7,119,525 B1 * 10/2006 Yoshino ......................... 323/283

FOREIGN PATENT DOCUMENTS
JP 10-032604 2/1998

* cited by examiner

Primary Examiner — Kim T Nguyen
(74) Attorney, Agent, or Firm — McDermott Will & Emery LLP (57) ABSTRACT

The present invention provides a method in which a counting source is provided in data after analog/digital conversion to lessen a load placed when new and old data after the conversion are compared to each other. A log function is prepared in an A/D conversion controlling circuit. The log function latches the output of a counter in a 12-bit digital/analog converter at the timing of outputting a pulse from a comparator to determine data written into a data register group. In the case where a setting item related to log output in an ADCR is set at 1, not only the output of the 12-bit digital/analog converter, but also the output of a timer counter of an MTU is latched as a log.

5 Claims, 8 Drawing Sheets

THEREAFTER, ANALOG/DIGITAL CONVERSION IS EXECUTED

ANALOG/DIGITAL CONVERSION CIRCUIT, SEMICONDUCTOR DEVICE, AND ELECTRIC POWER STEERING CONTROLLING UNIT

CROSS-REFERENCE TO RELATED APPLICATIONS

The disclosure of Japanese Patent Application No. 2009-184944 filed on Aug. 7, 2009 including the specification, drawings and abstract is incorporated herein by reference in its entirety.

BACKGROUND OF THE INVENTION

The present invention relates to management of data after being converted by an analog/digital conversion circuit, and particularly to an analog/digital conversion circuit of an in-vehicle semiconductor device for an automobile.

In recent years, CPUs and DSPs are provided at every part in an automobile, and data of various events (various data) generated in the automobile are sensed by the CPUs via sensors. The various data sensed by the CPUs and the like are fed back, and the CPUs provide functions. Further, when functions are provided by other CPUs and the like, the various data are transmitted to the other CPUs and the like via an in-vehicle communication network (for example, a LAN, a CAN (Control Area Network), an SCIF (Serial Communication Interface with FIFO), an I2C, and the like) to provide various functions in the automobile. A wide variety of examples of the functions include functions which are directly related to those of an automobile such as detection of torque generated by an engine and detection of the angle position of a steering wheel, functions necessary for securing safety required for a modern automobile such as an operation instruction to an air bag system, and functions for improving the comfort of a user such as control of an air conditioner and a GPS system, and control of a radio installed in the automobile.

In order to realize these functions, it is necessary to follow a series of procedures such as detection by a sensor, transmission to a CPU, determination of a controlled amount in the CPU, and execution of actual control. In the detection by a sensor, detected data are mostly analog data. A function of converting the analog data into digital data is performed by an analog/digital conversion circuit. The analog/digital conversion circuit samples and quantizes an analog signal output from the sensor to be converted into a digital signal. Such feedback control is periodically and continuously performed to catch up with changes in a system. A signal controlling process in which data after analog/digital conversion are referred to is started in a period of several tens of seconds to several hundreds of μ seconds in an automobile although it differs depending on functions.

In the analog/digital conversion circuit, an ADC is started in a single scan mode in a processing period shorter than the signal controlling process, and the converted digital data are buffered to a ring buffer in the order of conversion. Then, when the data of the ring buffer are used, the position of the latest data is calculated using the number of times of transfers of DMA, to refer to the data after the analog/digital conversion.

SUMMARY OF THE INVENTION

Japanese Unexamined Patent Publication No. Hei 10 (1998)-32604 describes an invention in which a sequence number and time information are inserted into communication information (data packet) used among a plurality of communication devices and are used as order information. The data packet usually includes data to be processed and management information, and the sequence number and the like can be inserted into the data packet as the management information.

On the other hand, in the case where analog information from a sensor is converted into a digital value in an analog/digital converter, the digital information is data themselves of the data packet to be processed. In the case where the sequence number is added, a data size is apparently increased.

Further, an analog/digital conversion process in a short period in the single scan mode by the analog/digital converter disadvantageously consumes the spare time of a CPU. Further, when the data of the ring buffer are used, it is necessary to calculate the position of the latest data every time at the beginning of the signal controlling process. Thus, a load on the signal controlling process is increased, and the spare time of the CPU is consumed in this point, too.

An object of the present invention is to provide a method in which a counting source is provided in data after analog/digital conversion to lessen a load placed when new and old data after the conversion are compared to each other.

The above and other objects and novel features of the present invention will become apparent from the description and the accompanying drawings of the present specification.

The followings are summarized descriptions of representative aspects of the present invention disclosed in this application.

An analog/digital conversion circuit according to a representative embodiment of the present invention includes an analog terminal to which an analog signal is input, a conversion circuit which converts the analog signal into a digital value, an order information generating unit, such as a counter, which generates order information, and registers into which the digital value converted from the analog value and the order information are stored for output.

In the analog/digital conversion circuit, there are further provided a controlling circuit which controls whether or not the order information is to be included in the digital value output from the analog/digital conversion circuit and a controlling information register.

Further, in the analog/digital conversion circuit, there is provided a processing circuit which determines, by using the digital value output from the analog/digital conversion circuit, the processing order of another digital value converted from the analog value that is included in the digital value on the basis of the order information included in the digital value.

A semiconductor device including the above-described analog/digital conversion circuit and an in-vehicle ECU (Electrical Control Unit) such as an electric power steering controlling unit using the semiconductor device also fall within the range of the present invention.

The followings are summarized effects obtained from the representative aspects of the present invention disclosed in this application.

It is possible to determine new or old data only by comparing the data to each other by using the analog/digital conversion circuit according to the representative embodiment of the present invention. Accordingly, it is possible to reduce processes of firmware which searches a ring buffer to determine new or old data and a CPU which operates the firmware.

DETAILED DESCRIPTION OF THE PREFERRED EMBODIMENTS

Hereinafter, embodiments of the present invention will be described using the drawings.

First Embodiment

Figure 1:
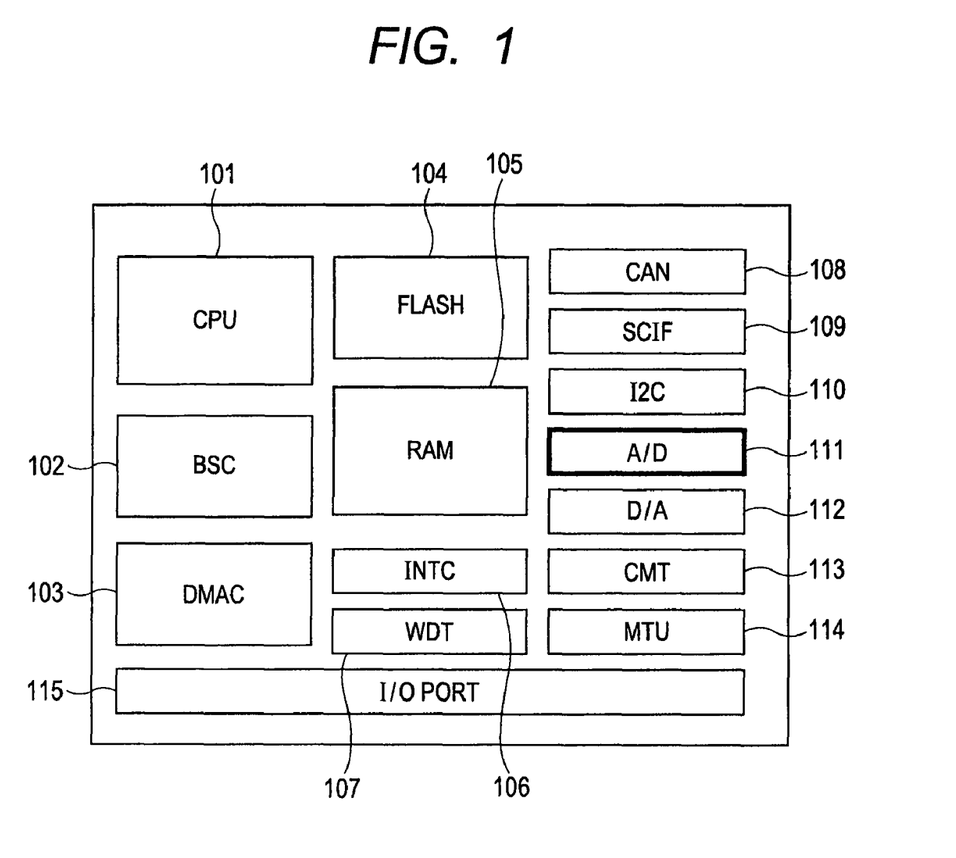
FIG. 1 is a conceptual diagram for explaining where an analog/digital conversion circuit according to the present invention is used in an actual LSI.

FIG. 1 is a conceptual diagram for explaining where an analog/digital conversion circuit according to the present invention is used in an actual LSI (semiconductor device). It should be noted that the LSI is supposedly used for an automobile.

The LSI is comprised of a CPU 101, a BSC 102, a DMAC 103, a FLASH 104, a RAM 105, an INTC 106, a WDT 107, a CAN 108, an SCIF 109, an I2C 110, an A/D 111, a D/A 112, a CMT 113, an MTU 114, and an I/O port 115.

The CPU (Central Processing Unit) 101 is a CPU core including a central processing unit and peripheral circuits.

The BSC (Bus State Controller) 102 is a bus controller for controlling an internal bus of the LSI.

The DMAC (Direct Memory Access Controller) 103 is a DMA controller used when data are transmitted or received via the internal bus of the LSI without occupying the CPU 101.

The FLASH 104 is a storage region using a Flash ROM that is a nonvolatile semiconductor memory. Further, the RAM 105 is a storage region using a volatile memory. The FLASH 104 or the RAM 105 is used depending on the situation in consideration of applications and the life of the FLASH 104.

The INTC (INTerrupt Controller) 106 is an interrupt controller used for a hardware interrupt process and a software interrupt process. The main content of the process of the INTC 106 is to output an interrupt signal to the CPU 101 when receiving an interrupt request signal for a process that is higher in priority than that of the software being executed.

The WDT (Watch Dog Timer) 107 is a watch dog timer used for detecting failure of a program to run.

The CAN (Control Area Network) 108 is a module adapted for a CAN interface to establish an in-vehicle LAN for an automobile. The SCIF (Serial Communication Interface) 109 is a module adapted for a serial communication interface.

The I2C 110 is a module adapted for a so-called microwire. The I2C protocol is a kind of asynchronous communications, and there are a start phase and a bus end phase for the I2C protocol.

The A/D 111 is a general-purpose analog/digital conversion circuit. Not only the A/D 111 as an abbreviated form, but also an analog/digital conversion circuit 111 also denotes this component.

The D/A 112 is a general-purpose digital/analog conversion device.

The CMT (Compare Match Timer) 113 is a timer circuit which outputs an interrupt signal when the value of a timer reaches a predetermined setting value.

The MTU (Multi function Timer Unit) 114 is not a specialized timer such as the CMT 113, but a timer adapted for various functions such as a subtraction process and a difference in an output waveform. The MTU 114 or the CMT 113 is used depending on the situation by a high-order application, and thus the usage thereof will not be herein described.

The I/O port 115 is an interface circuit through which signals are input or output into/from other components in the LSI. The I/O port 115 is used for internal circuits, and synchronous communications are mostly performed in the I/O port 115.

The analog/digital conversion circuit according to the present invention corresponds to the A/D 111.

Figure 2:
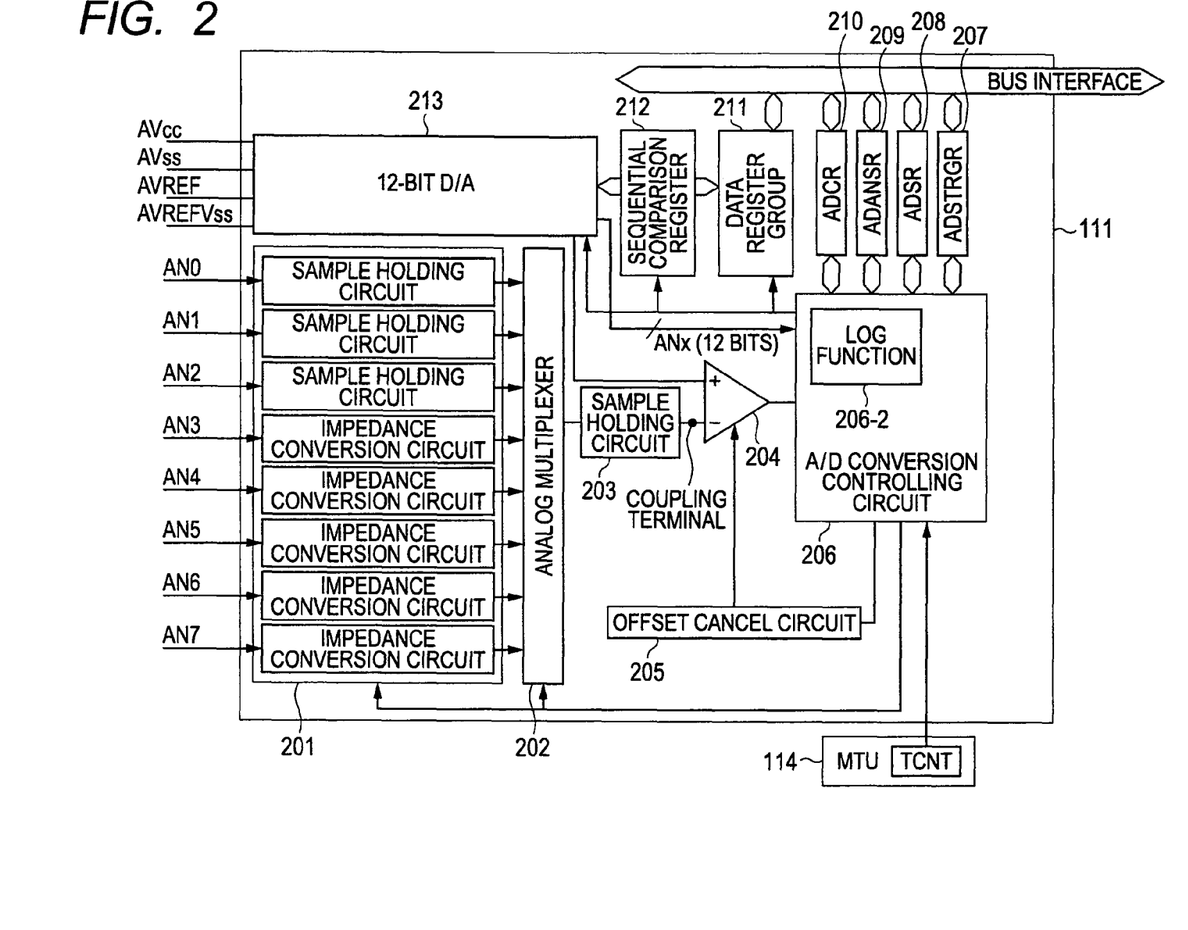
FIG. 2 is a block diagram for showing a configuration of the analog/digital conversion circuit according to a first embodiment of the present invention.

FIG. 2 is a block diagram for showing a configuration of the analog/digital conversion circuit 111 according to the present invention. The analog/digital conversion circuit is of a sequential comparison type. The analog/digital conversion circuit 111 according to the present invention will be described using FIG. 2.

The analog/digital conversion circuit is comprised of an input terminal circuit group 201, an analog multiplexer 202, a sample holding circuit 203, a comparator 204, an offset cancel circuit 205, an A/D conversion controlling circuit 206, an ADSTRGR 207, an ADSR 208, an ADANSR 209, an ADCR 210, a data register group 211, a sequential comparison register 212, and a 12-bit digital/analog converter 213.

The input terminal circuit group 201 is a protection circuit group provided at input terminals of the sample holding circuits, impedance conversion circuits, and the like as shown in the drawing. The sample holding circuit is a circuit for holding the electric potential of an input signal for a certain period of time. The impedance conversion circuit is an impedance matching circuit to match the impedance of the input signal.

The analog multiplexer 202 is a switch circuit for determining one of input signals (there are 8 lines in the drawing) from the input terminal circuit group 201 as a target of analog/digital conversion.

The sample holding circuit 203 is a circuit for temporarily holding electric potential when a signal output from the analog multiplexer 202 is compared by the comparator 204.

The comparator 204 is a comparator for comparing the output of the 12-bit digital/analog converter 213 serving as the reference standard when the analog/digital conversion is performed, with the output of the sample holding circuit 203.

When the output of the 12-bit digital/analog converter 213 becomes higher than that of the sample holding circuit 203, the comparator 204 outputs a pulse to the A/D conversion controlling circuit 206. The output pulse serves as a timing signal to latch in the A/D conversion controlling circuit 206.

It should be noted, as described above, that the comparator 204 includes two input terminals to one of which the output of the sample holding circuit 203 is input and to the other of which the output of the 12-bit digital/analog converter 213 is input. Of the two input terminals, the terminal to which the output of the sample holding circuit 203 is input is referred to as a coupling terminal.

The offset cancel circuit 205 is a circuit for resetting the comparator 204.

The A/D conversion controlling circuit 206 is a controlling circuit for controlling the entire analog/digital conversion circuit 111. When the comparator 204 outputs a pulse, the A/D conversion controlling circuit 206 is latched, so that the value of a counter of the 12-bit digital/analog converter 213 and a part of the value of a timer counter TCNT output from the MTU 114 are written into an arbitrary data register of the data register group 211. It should be noted that "a part of the value of a timer counter TCNT" will be described in FIG. 5.

The A/D conversion controlling circuit 206 includes a log function 206-2.

The ADSTRGR 207 is a register circuit for selecting a trigger starting the analog/digital conversion.

The ADSR 208 is a status register for setting a status of the analog/digital conversion.

The ADANSR 209 is a register into which data are written to switch and set the analog multiplexer 202. With reference to the value of the register, the A/D conversion controlling circuit 206 switches the analog multiplexer 202.

The ADCR 210 is a controlling register for various control settings for the analog/digital settings conversion. The ADCR 210 has setting parameters for a scan mode and an item for setting "on" or "off" of log output that is directly related to the present invention. It should be noted that 1 indicates that the setting item related to the log output is set at "on", and 0 indicates that the setting item is set at "off".

It should be noted that both of the ADSR 208 and the ADCR 210 may be integrally configured as one register. Further, it is desirable that these registers are capable of writing and reading viewed from the bus interface side. On the assumption of that, the embodiment will be hereinafter described.

The data register group 211 is an address register group used when data are written into the respective registers. In the present invention, the data register group 211 includes 8 sets of data registers.

The sequential comparison register 212 is a setting register for sequential comparison. The A/D conversion controlling circuit 206 dynamically sets the register, so that the sequential comparison can be performed The 12-bit digital/analog converter 213 is a counter and a digital/analog converter which determines the value when the comparator 204 outputs "1", as a conversion result (digital data) of analog data. If the voltage of the analog output of the 12-bit digital/analog converter 213 exceeds the analog multiplexer 202, the 12-bit digital/analog converter 213 stops to count up, and quantization is regarded as being completed using the value of the counter at the time.

As the name suggests, the 12-bit digital/analog converter 213 is a 12-bit circuit. Accordingly, the counter of the 12-bit digital/analog converter 213 is also a 12-bit counter. The output of the 12-bit counter is represented as ANx in FIG. 2. The output ANx of the counter is output to the log function 206-2 of the A/D conversion controlling circuit 206.

The 12-bit analog/digital conversion is performed for the reason of the efficiency of conversion and easy handling. Data are usually handled in an 8-bit unit. As larger units, there are a 16-bit unit and a 32-bit unit (a 24-bit unit in some cases). Accordingly, if the data unit exceeds 16 bits, the data unit itself to be handled becomes large. On the other hand, in the case of 8 bits, the resolution of quantization is impractical, and thus an appropriate data unit falls within a range of no less than 9 bits and no more than 16 bits.

However, higher resolution requires a high-frequency clock. From this point of view, 12-bit quantization has been common in the analog/digital conversion circuit for an automobile.

4 bits as a difference between a data unit of 16 bits and 12 bits after the analog/digital conversion are discarded by masking or the like in the conventional technique.

On the contrary, the excess 4 bits are actively used in the present invention. In the present invention, the A/D conversion controlling circuit 206 recognizes the order of the analog/digital conversion, and records the order into the 4 bits. Accordingly, the 4 bits functions as a log. At this time, the A/D conversion controlling circuit 206 uses the output of the timer counter TCNT of the MTU 114.

It should be noted that the embodiment will be described on the assumption that the setting item for activating the log output function is provided in the ADCR 210.

Next, the operation of the A/D conversion controlling circuit 206 will be described.

Figure 3:
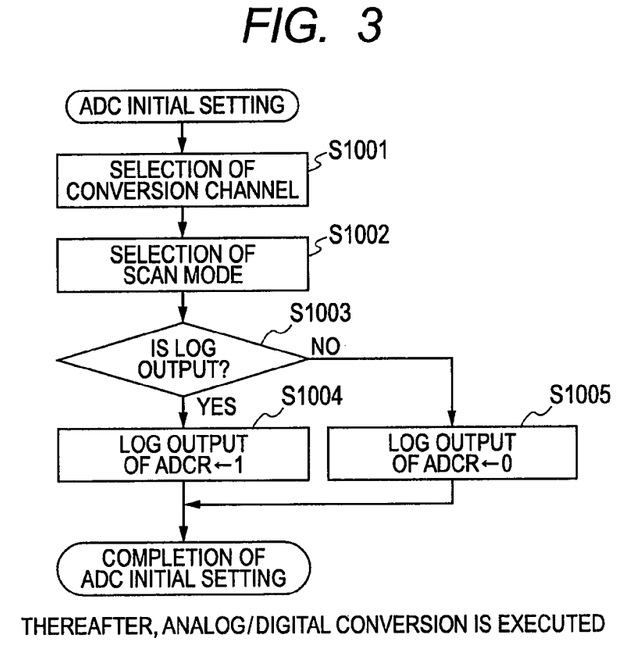
FIG. 3 is a flowchart for showing an initial setting process of an A/D conversion controlling circuit according to the first embodiment of the present invention.

FIG. 3 is a flowchart for showing an initial setting process of the A/D conversion controlling circuit 206 according to the present invention.

In the first place, the A/D conversion controlling circuit 206 operates the analog multiplexer 202 on the basis of the ADANSR 209 to select an input as a target of the analog/digital conversion (step S1001).

Next, the scan mode is set on the basis of the setting parameter for the scan mode included in the ADCR 210 (step S1002).

Next, the A/D conversion controlling circuit 206 determines whether or not the log is to be output (step S1003). The followings are examples of determining whether or not the log is to be output: 1) whether or not the log is to be output is determined on the basis of the type of an input; 2) the item related to the log output in the ADCR 210 is set at "on" (set by a high-order application); and the like. Determination of which method is used is a design matter.

In the case where it is determined that the log is to be output (step S1003: Yes) and data can be written into the ADCR 210 by the A/D conversion controlling circuit 206, the A/D conversion controlling circuit 206 sets the setting item related to the log output in the ADCR 210 at 1 (step S1004). On the other hand, in the case where the log is not to be output, the A/D conversion controlling circuit 206 sets the setting item related to the log output in the ADCR 210 at 0 (step S1005).

Then, the initial setting process is completed. Thereafter, the analog/digital conversion will be started.

Figure 4:
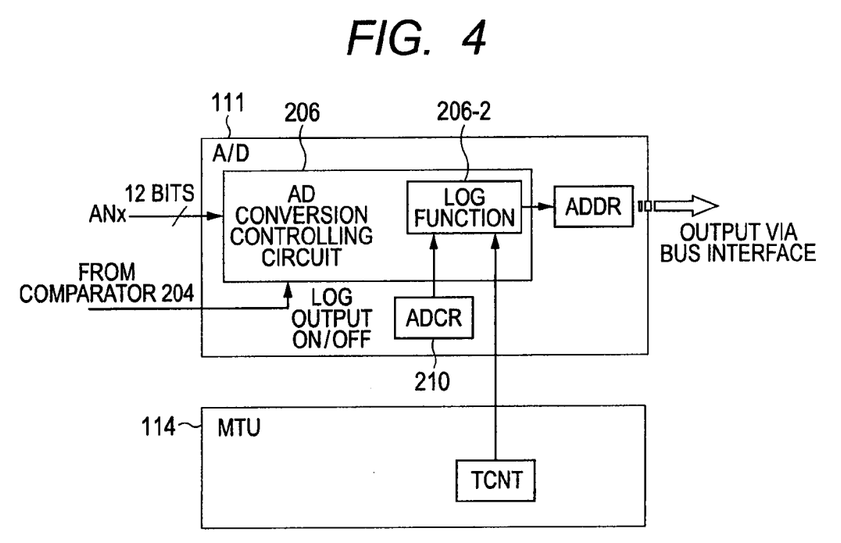
FIG. 4 is a conceptual diagram of a hardware operation following the control in FIG. 3.

FIG. 4 is a conceptual diagram of a hardware operation following the control in FIG. 3.

The output (the ANx in FIG. 2 and FIG. 4) of the counter in the 12-bit digital/analog converter 213 is input into the A/D conversion controlling circuit 206.

The log function 206-2 in the A/D conversion controlling circuit 206 is operated with a pulse output from the comparator 204. The pulse from the comparator 204 is input into the log function 206-2, the log function 206-2 reads the setting item related to the log output in the ADCR 210. The setting of the log output is already done in the steps S1004 and S1005.

In the case where the log is to be output (the setting item related to the log output indicates 1), the output of the timer counter TCNT of the MTU 114 and the output ANx of the counter in the 12-bit digital/analog converter 213 are collectively recorded into a predetermined data register ADDR of the data register group 211.

Figure 5:
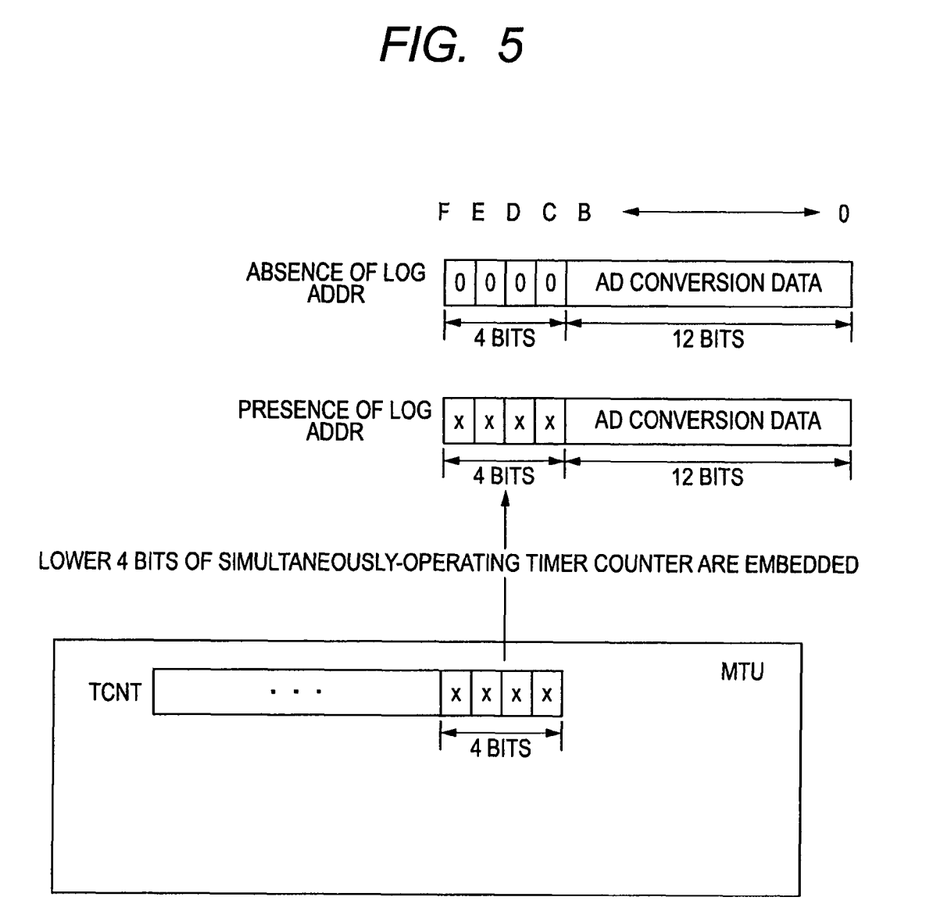
FIG. 5 is a conceptual diagram for comparing an output when a log function of the analog/digital conversion circuit according to the first embodiment of the present invention is set at "on", with an output when the log function thereof is set at "off"

On the other hand, in the case where the log is not to be output (the setting item related to the log output indicates 0), only the output ANx of the counter of the 12-bit digital/analog converter 213 is recorded into the predetermined data register ADDR of the data register group 211 without including the output of the timer counter TCNT of the MTU 114. Referring to FIG. 5 helps understanding of a difference in data after the analog/digital conversion.

As described above, the analog/digital conversion is performed after the initial setting, and the analog/digital conversion circuit 111 outputs a quantized digital signal.

The output result will be described.

FIG. 5 is a conceptual diagram for comparing an output when the log function of the analog/digital conversion circuit 111 according to the present invention is set at "on", with an output when the log function thereof is set at "off". It should be noted that the output of the analog/digital conversion circuit 111 is 16-bit data in which lower bits are illustrated on the right side and higher bits are illustrated on the left side in the drawing.

The output of the analog/digital conversion circuit 111 is written into the data register ADDR included in the data register group 211. The result of the analog/digital conversion is basically stored into the ADDR while being aligned on the lower-bit side (to the right corresponding to a bit 0 in the drawing).

When the log function is set at "off", 0 is input into each of higher 4 bits, namely, bits C, D, E, and F in the drawing. On the contrary, when the log function is set at "on", lower 4 bits of the timer counter TCNT in the MTU 114 are stored into these bits. By taking the measure, new and old data can be compared to each other between the data registers ADDR included in the data register group 211.

Accordingly, a load placed on software at the time of determination of new or old analog/digital conversion can be lessened, and unreasonable sharing of peripheral modules can be reduced, thus leading to an improvement in usability.

It should be noted that the lower 4 bits of the timer counter TCNT are used in the above-described example. However, instead of using the lower 4 bits, arbitrary 4 bits, for example, continuous higher bits such as bits 8, 9, A, and B of the timer counter TCNT, or a combination of discontinuous bits such as bits 4, 5, 8, and 9 may be used, so that a period of executing the analog/digital conversion can be adjusted.

Further, like a counter, 1 may be added every time to be used as a log. For more detail, refer to a second embodiment.

A method of using the LSI including the analog/digital conversion circuit 111 will be examined.

Figure 6:
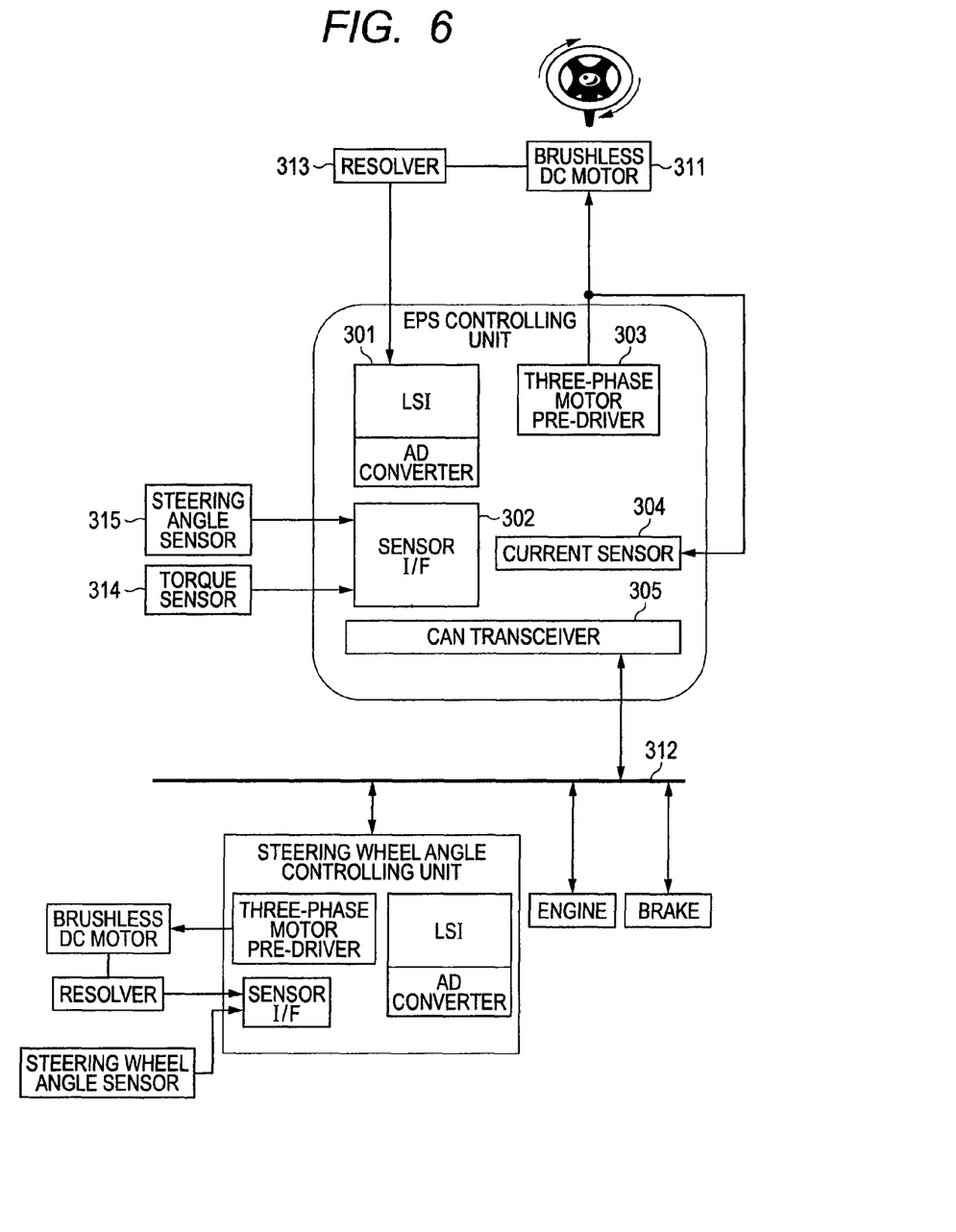
FIG. 6 is a conceptual diagram of an EPS (Electric Power Steering) controlling unit using the LSI according to the present invention.

FIG. 6 is a conceptual diagram related to an in-vehicle ECU network including an EPS (Electric Power Steering) controlling unit using the LSI according to the present invention. The EPS controlling unit is provided to control steering assist by inputting information related to a vehicle speed and steering and information of a brushless DC motor.

The EPS controlling unit is comprised of an LSI 301, a sensor I/F 302, a 3-phase motor pre-driver 303, a current sensor 304, and a CAN transceiver 305.

The LSI 301 corresponds to that of FIG. 1 according to the present invention, and incorporates therein the analog/digital conversion circuit 111. In the case where the LSI 301 is used in the EPS controlling unit, information of an engine and a brake is sequentially input into the CAN 108 via the CAN transceiver 305, and steering wheel controlling information is output to a steering wheel controlling unit.

Further, the angle of the steering, the torque of the engine (both are input via the sensor I/F 302), information of a motor angle from a resolver, and motor current information from the current sensor 304 are input, as respective input signals, into the input terminal circuit group 201 of the analog/digital conversion circuit 111.

Further, the MTU 114 of the LSI 301 outputs a clock to a PWM (Pulse With Modulation) of the motor.

The sensor I/F 302 is an interface through which inputs from a torque sensor 314 and a steering angle sensor 315 are output to the analog/digital conversion circuit 111 of the LSI 301.

The 3-phase motor pre-driver 303 is a driver circuit which generates controlling current for generating torque in a 3-phase motor by allowing current to flow into respective coils with a U-phase, V-phase, and a W-phase configuring the 3-phase motor. The output of the 3-phase motor pre-driver 303 is output to the brushless DC motor 311.

The current sensor 304 is a current sensor for feeding back to the LSI 301 the current output from the 3-phase motor pre-driver 303 to the brushless DC motor 311.

The CAN transceiver 305 is a transceiver unit which receives information of the engine and the brake input via the CAN 312 and transmits the information to an appropriate destination (the LSI 301 in the drawing), or which outputs a command from the LSI 301 to the engine or the brake.

The EPS controlling unit mainly performs signal control and motor control. In the signal control, analog signals such as the information related to the angle of the motor from the resolver 313, the motor current information from the current sensor 304, and steering torque information from the torque sensor 314 are input. These input signals are converted into digital signals by the analog/digital conversion circuit 111, and then internal data used when controlling the brushless DC motor 311 (hereinafter, referred to as motor control) are generated.

In the motor control, the current output from the 3-phase motor pre-driver 303 to the brushless DC motor 311, and the torque and revolutions of the brushless DC motor 311 are adjusted for the optimum amount of steering assist on the basis of the data generated by the signal controlling process.

It is necessary to process an analog signal that is a target handled in the signal control, as continuous data. Thus, it is necessary to determine the order of the analog/digital conversion. The analog/digital conversion is generally started in a period of several tens of $\mu$ seconds to several hundreds of $\mu$ seconds although it largely differs depending on the characteristics of a signal as a target of the analog/digital conversion.

Further, the EPS controlling unit converts an analog value from the steering angle sensor into a digital value while adding order information, and outputs the resultant as steering wheel controlling information. The steering wheel controlling unit which changes and controls the angle of the steering wheel determines the order of processing plural pieces of steering wheel controlling information to which the order information that is output from the EPS controlling unit and input via the CAN network is added, on the basis of the order information included in the steering wheel controlling information, and controls the motor which changes the angle of the steering wheel.

Specifically, the EPS controlling unit is an analog/digital converter which converts analog values output from the resolver and the steering angle sensor into digital values.

Figure 7:
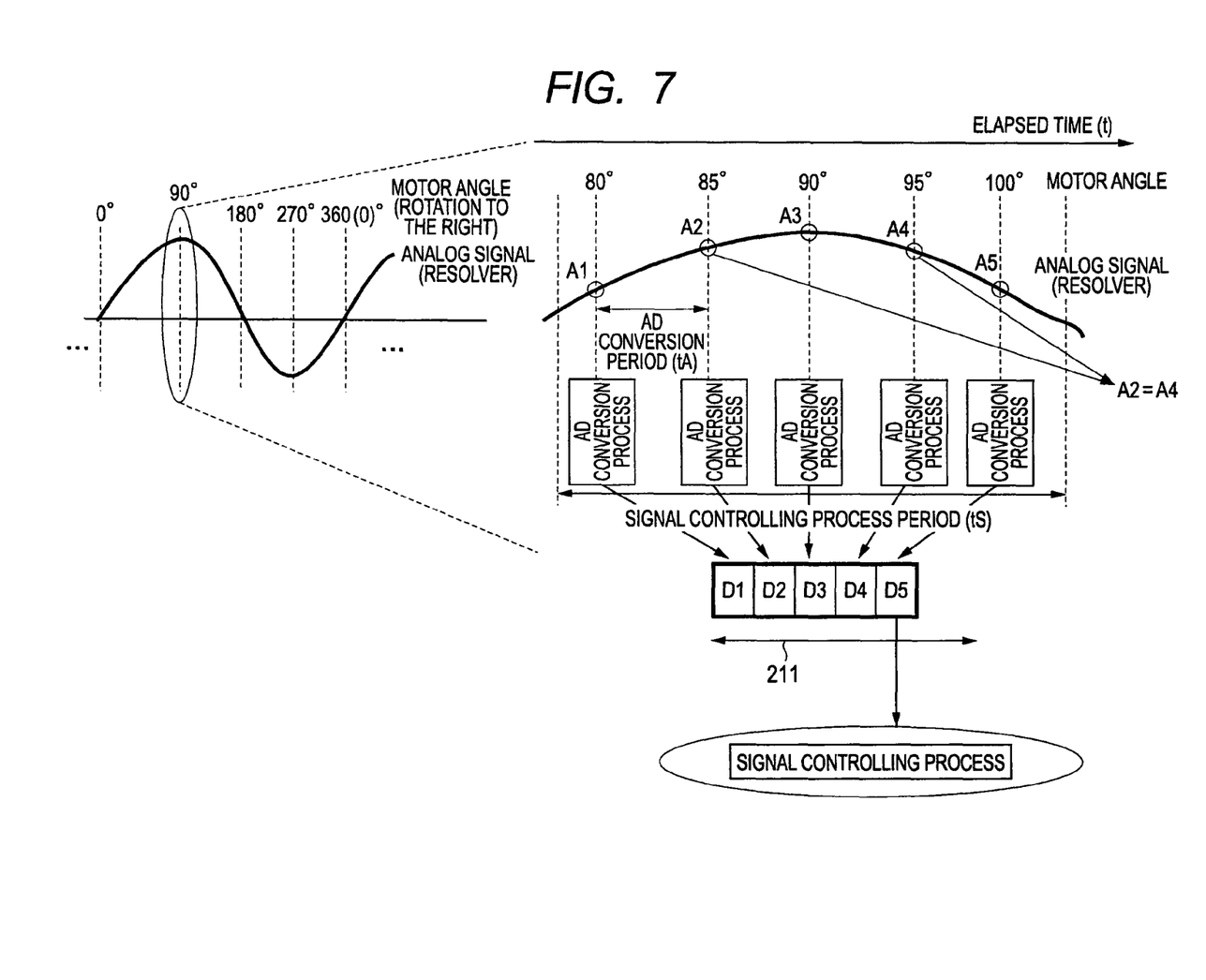
FIG. 7 is a schematic diagram for explaining advantages of the analog/digital conversion circuit according to the present invention

FIG. 7 is a schematic diagram for explaining advantages of the analog/digital conversion circuit according to the present invention.

In the signal control, in addition to detection of the current motor angle, it is also required to determine whether the current rotational direction is right or left and to detect inverse rotation, stop, and abnormal revolutions of the motor. At this time, it is necessary to set measurement points at periods shorter than those of a signal as a measurement target. At this time, substantially the same values can be obtained at measurement points A2 and A4 in many cases as shown in FIG. 7.

In the case where the log is not added to the result of the analog/digital conversion, it is necessary to start the ADC in the single scan mode at periods shorter than those of the signal controlling process. Accordingly, there is a possibility that the spare time of the LSI 301 is consumed more than necessary. In this case, it is necessary to determine on the basis of the volumes of previous and subsequent data using, for example, A1, A3, and A5. If the number of measurement points is increased, an accurate situation can be recognized. However, the increase in the measurement points directly leads to an increase in the number of times of analog/digital conversion, and thus the processing time of the CPU is largely increased.

Further, it is necessary to perform FIFO buffering using a ring buffer so as to hold the order of the analog/digital conversion. In FIG. 7, the buffers are simply aligned in the data register group 211. Actually, it is necessary to manage space areas and to calculate the latest data position using the number of times of DMA transfers. In this point, too, the processing time of the LSI 301 is consumed.

As a result, the signal control and the motor control cannot be possibly processed within a period of time due to the consumption of the processing time of the LSI, and the EPS controlling unit needs to wait for processing. As a drastic measure to solve this problem, a high-performance, high-priced LST 301 is used, which disadvantageously causes an increase in costs of the EPS controlling system and the whole apparatus.

On the contrary, if the log is included in an output itself as in the analog/digital conversion circuit 111 according to the present invention, firmware only refers to data in the signal controlling process, so that new or old data can be determined. Accordingly, a load on the signal controlling process such as recognition of a relation between previous data and subsequent data can be lessened, and the spare time of the LSI 301 can be secured.

Further, it is possible to search for the latest data using a high-speed searching method such as a binary search. Thereby, the load on the signal controlling process can be lessened, and the spare time of the LSI 301 can be secured.

It is possible to simplify firmware and to reduce the processing time of the LSI 301 by using the analog/digital conversion circuit 111 according to the present invention.

Securing of the spare time of the LSI 301 leaves room for changes and addition of the specification. Further, it is possible to improve controlling accuracy by shortening the periods of starting the controlling process. Furthermore, the degraded specifications of a microcomputer and elimination of a sub-microcomputer lead to cost reduction.

It is obvious that the above-described embodiment can be variously changed in a range without departing from the gist of the present invention. For example, the embodiment has been described above on the assumption that the data are handled in a 16-bit unit and the data length of the output of the analog/digital conversion circuit is 12 bits. The followings fall within the range of the application: the data length is increased to as large as 24 bits or 32 bits; the data length of the output of the analog/digital conversion circuit is less than 12 bits or more than 12 bits; and only a part of a space area is used for the log.

Second Embodiment

Next, a second embodiment of the present invention will be described.

Figure 8:
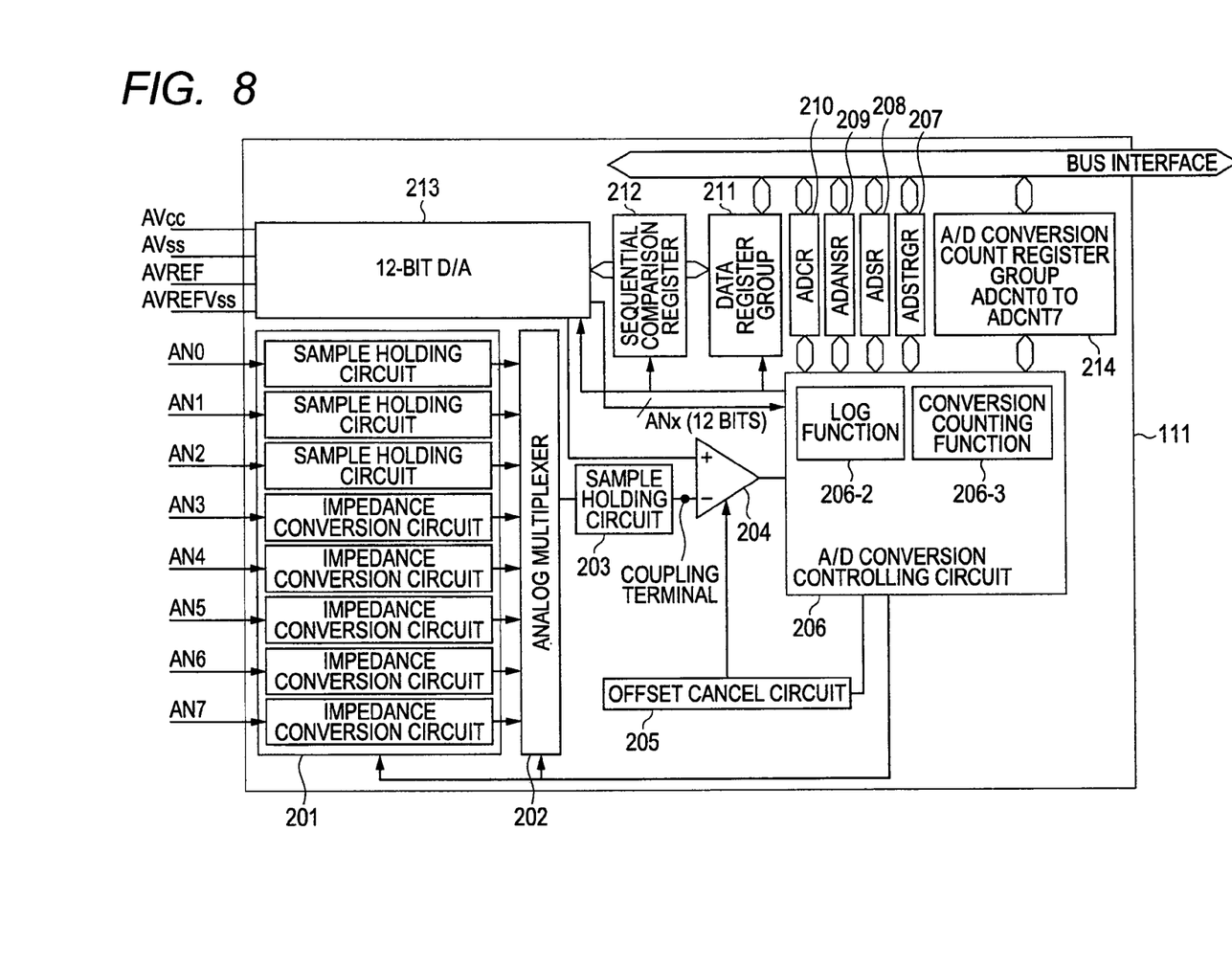
FIG. 8 is a block diagram for showing a configuration of an analog/digital conversion circuit according to a second embodiment of the present invention.

FIG. 8 is a block diagram for showing a configuration of an analog/digital conversion circuit according to the second embodiment of the present invention.

In the first embodiment, a part of the value of the timer counter TCNT of the MTU 114 is used as a log. On the contrary, a dedicated analog/digital conversion counting function 206-3 is provided in the A/D conversion controlling circuit 206 in the second embodiment. In addition, an A/D conversion count register group 214 for recording the number of counts is provided. The second embodiment is characterized in that these units are operated in cooperation with the log function 206-2.

These additional features will be described.

The followings are functions of the analog/digital conversion counting function 206-3: 1) the value of an appropriate counter register in the A/D conversion count register group 214 is read in accordance with an input signal; 2) when the analog/digital conversion is completed, 1 is added to an initial value that is the read value of the counter register; and 3) after completion of the analog/digital conversion, the read value of the counter register is overwritten prior to starting of different analog/digital conversion.

It should be noted that a pulse output from the comparator 204 may trigger the addition in 2). However, it is necessary to determine the value to be output to the log function 206-2 by the analog/digital conversion counting function 206-3 at the timing when the log function 206-2 is latched. Thus, there need such design arrangements that the count is up at a front edge of a pulse and the log function 206-2 is latched at a rear edge of the pulse.

The value added in the analog/digital conversion counting function 206-3 is output to the log function 206-2. The log function 206-2 uses the value as the log instead of the timer counter TCNT output from the MTU 114 in the first embodiment. In the case where the setting item related to the log output in the ADCR 210 indicates 1, the log function 206-2 uses the output value of the analog/digital conversion counting function 206-3 together with the value of the counter of the 12-bit digital/analog converter 213 as part of data written into the data register ADDR after the analog/digital conversion.

The A/D conversion count register group 214 is a group of counter registers adapted for input signals. In FIG. 8, there are 8 lines for input signals. Thus, 8 counter registers ADCNT0 to ADCNT7 are present in the A/D conversion count register group 214.

The counter registers ADCNT0 to ADCNT7 are associated with input terminals AN0 to AN7, respectively. When performing the analog/digital conversion for AN0, the A/D conversion count register group 214 reads the value of the counter register ADCNT0. Further, when completing the analog/digital conversion for AN0, the A/D conversion count register group 214 writes the value of the counter at the time of the completion into the counter register ADCNT0.

The respective counter registers of the A/D conversion count register group 214 can be read through the bus interface. Further, a high-order CPU 101 may overwrite the respective counter registers. For example, the counter registers may be designed as follows: the counter register associated with the input terminal where the conversion is already performed is reset to 0 every time the conversion is completed.

Figure 9:
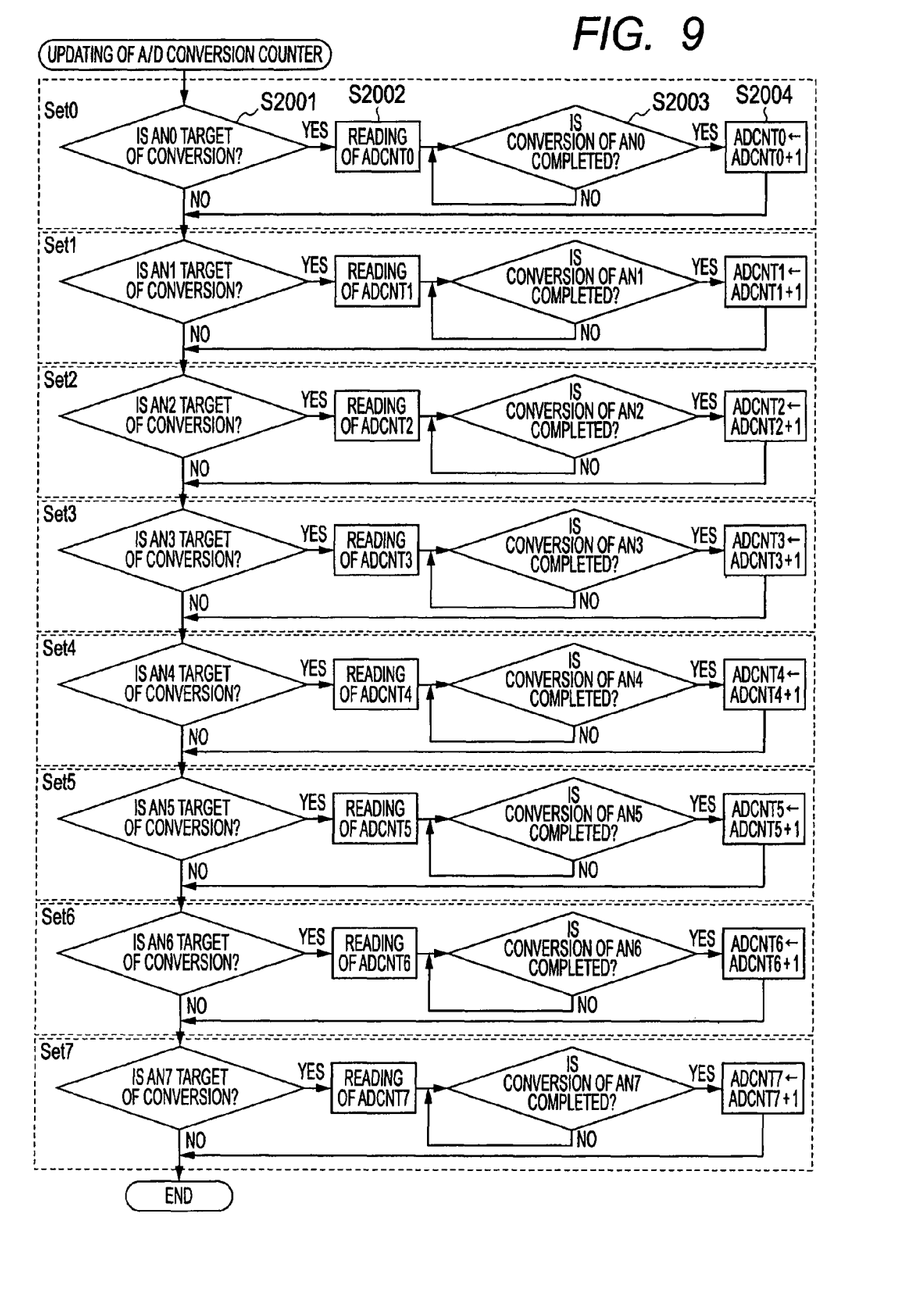
FIG. 9 is a flowchart for showing processes performed by an analog/digital conversion counting function according to the second embodiment of the present invention.

FIG. 9 is a flowchart for showing processes performed by the analog/digital conversion counting function 206-3 according to the second embodiment of the present invention. A series of processes are represented by Setn (n=0 to 7) in accordance with numbers of the input terminals. In these processes, the input terminals are different but the operations are all the same. Thus, only a process for the input signal AN0 will be described.

In the first place, the A/D conversion controlling circuit 206 already determines an input terminal where the analog/digital conversion is performed for the next time, prior to starting of the process. In accordance with the determination, the analog/digital conversion counting function 206-3 confirms which input terminal is to be processed (step S2001).

If the corresponding input terminal can be specified (step S2001: Yes), the analog/digital conversion counting function 206-3 reads the value of the counter register ADCNT0 corresponding to the input terminal (step S2002). It is desirable to read the value at the timing before starting the analog/digital conversion. However, the value may be read before the analog/digital conversion is completed.

If the analog/digital conversion for the input terminal AN0 is completed (step S2003: Yes), 1 is added to the read value of the counter register. The counter register ADCNT0 from which the value was read is updated to the sum (step S2004). Then, the sum is output to the log function 206-2. The log function 206-2 uses the value as the log, instead of the timer counter TCNT output from the MTU 214 in the first embodiment.

The invention achieved by the inventors has been concretely described above on the basis of the embodiments. However, it is obvious that the present invention is not limited to the above-described embodiments, but may be variously changed in a range without departing from the gist of the present invention.

There has been described above an example of applying the LSI according to the present invention to the EPS controlling unit for an automobile. However, the present invention is not limited to the above, but can be applied to all devices in which analog/digital conversion is continuously required.

What is claimed is:

1. An analog/digital conversion circuit comprising:
a coupling terminal to which an analog signal as a target of analog/digital conversion is input;
a counter;
a digital/analog converter which converts an output value of the counter into an analog value;
a comparator which outputs a first pulse when an output of the digital/analog converter is larger than the analog signal that is input into the comparator;
an output register;
an analog/digital conversion controlling circuit; and
a timer input terminal for inputting an input value,
wherein when the output of the digital/analog converter is larger than the analog signal as a target of the analog/digital conversion, a second pulse is output, and
wherein the analog/digital conversion controlling circuit receives the output of the digital/analog converter and the input value via the timer input terminal, and sets the output of the digital/analog converter and the input value to the output register.

2. An analog/digital conversion circuit comprising:
a coupling terminal to which an analog signal as a target of analog/digital conversion is input;
a counter;
a digital/analog converter which converts an output value of the counter into an analog value;
a comparator which outputs a pulse when an output of the digital/analog converter is larger than the analog signal that is input into the comparator;
an output register;
an analog/digital conversion controlling circuit;
a timer input terminal; and
a setting register,
wherein when the output of the digital/analog converter is larger than the analog signal as a target of the analog/digital conversion, a pulse is output, and
wherein when the analog/digital converter receives the pulse, the analog/digital conversion controlling circuit sets one of the output value of the counter, and the input value of the timer input terminal to the output register in accordance with a value stored in the setting register.

3. The analog/digital conversion circuit according to claim 2, further comprising:
an analog multiplexer,
wherein the analog/digital conversion controlling circuit controls a signal output to a coupling terminal by the analog multiplexer.

4. A semiconductor device comprising the analog/digital conversion circuit according to claim 3.

5. An electric power steering controlling unit, using the semiconductor device according to claim 4.

* * * * *